United States Patent [19]

Takaki et al.

[11] Patent Number: 4,609,886
[45] Date of Patent: Sep. 2, 1986

[54] PLL MODULATION CIRCUIT

[75] Inventors: Hisashi Takaki; Fumio Matsushita, both of Tokyo, Japan

[73] Assignee: Pioneer Electronic Corporation, Tokyo, Japan

[21] Appl. No.: 715,308

[22] Filed: Mar. 25, 1985

[30] Foreign Application Priority Data

Mar. 23, 1984 [JP] Japan .................................. 59-56931

[51] Int. Cl.$^4$ .............................................. H03C 3/00
[52] U.S. Cl. .................................... 332/19; 332/16 R; 332/30 V; 375/44; 455/42; 455/110; 455/113
[58] Field of Search ...................... 332/16 R, 19, 30 V; 375/44, 45, 52, 62, 65, 67; 455/42, 110, 113, 119

[56] References Cited

U.S. PATENT DOCUMENTS 4,546,331 8/1985 DaSilva et al. ...................... 332/19

Primary Examiner—Eugene R. LaRoche
Assistant Examiner—James C. Lee
Attorney, Agent, or Firm—Sughrue, Mion, Zinn, Macpeak, and Seas

[57] ABSTRACT

A phase-locked loop modulation circuit, such as may be used for a data communications purposes, in which undesired level variations are eliminated by employing d.c. coupling entirely. The circuit includes a level converter circuit which converts a logic signal into a signal having substantially equal levels above and below a predetermined voltage, a voltage-controlled oscillator, and a circuit for superposing the signal having substantially equal levels on a control voltage of the voltage-controlled oscillator so that the output of the voltage-controlled oscillator is subjected to angular modulation. In accordance with the invention, the level converter circuit includes a pair of voltage dividing resistors which divide the supply voltage, a pair of series circuit each composed of a resistor and a switch element connected in parallel with each of the series circuits being connected in parallel to a respective one of the pair of voltage dividing resistors, and a gating circuit for complementarily operating the switch elements on and off in accordance with the logic outputs signal.

5 Claims, 16 Drawing Figures

FIG. 1
PRIOR ART
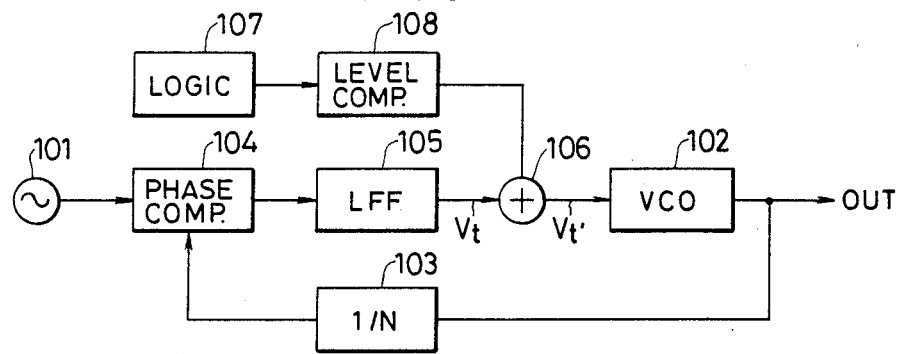
FIG. 2
PRIOR ART
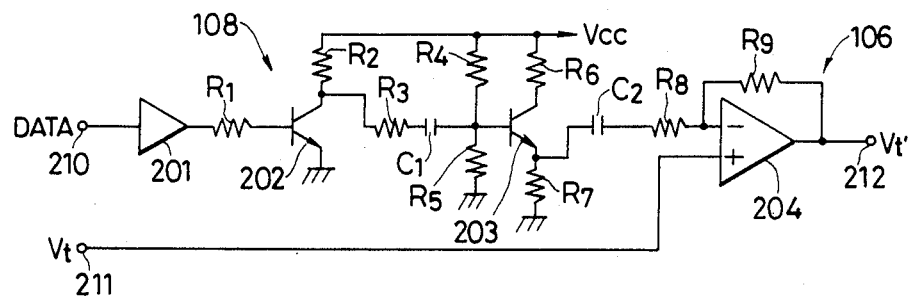
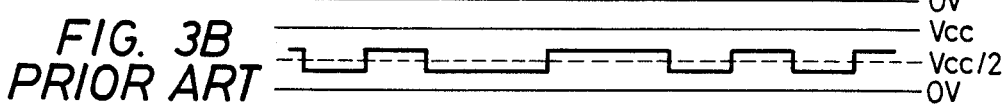
FIG. 3A PRIOR ART
FIG. 3B PRIOR ART
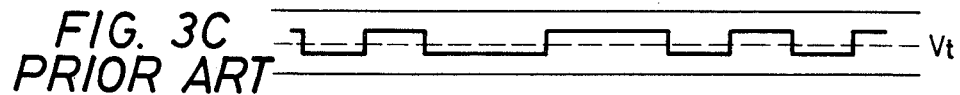
FIG. 3C PRIOR ART

FIG. 4A PRIOR ART
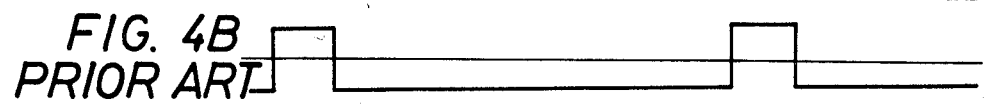
FIG. 4B PRIOR ART
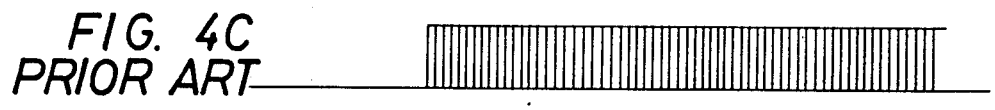
FIG. 4C PRIOR ART
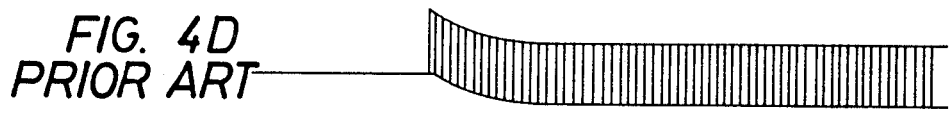
FIG. 4D PRIOR ART
FIG. 5
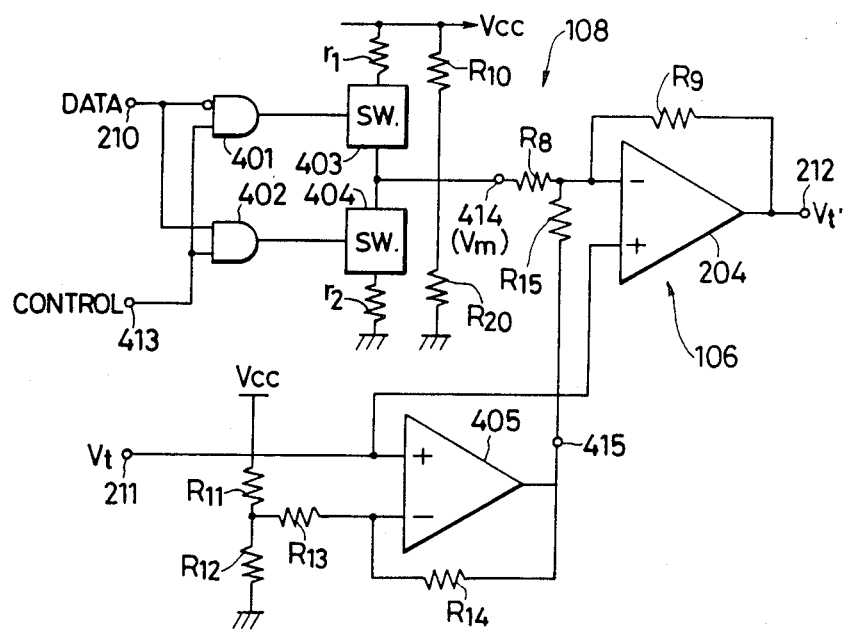

PLL MODULATION CIRCUIT

BACKGROUND OF THE INVENTION

The present invention relates to PLL (Phase-Locked Loop) modulation circuits, and more particularly to a frequency modulation circuit using a PLL for data communications.

Frequency modulation using a PLL circuit is, in general, carried out using a system as shown in FIG. 1. In FIG. 1, reference numeral 101 designates a reference oscillator. The oscillation output of the reference oscillator 101 is applied to a phase comparator 104. The output of a VCO (Voltage-Controlled Oscillator) is applied to a frequency divider 103, the frequency division output of which is applied to the phase comparator 104. Thus, the oscillation output of the oscillator 101 and the frequency division output are subjected to phase comparison. The comparison output of the phase comparator 104 is applied as a control signal through an LPF (Low-Pass Filter) 105 and an adder 106 to the VCO 102. Further, a logic circuit 107 provides logic data as a modulating signal. The logic data is subjected to level conversion by a level converter 108 and the result applied to the adder 106. Accordingly, the logic data is superposed on the output of the LPF 105 in a DC mode so as to be used as the control signal for the VCO 102. Thus, an FM signal corresponding to the logic data is provided at the output of the VCO 102.

If the PLL modulation circuit is employed for data communication, since the modulating signal is the output of the logic circuit 107, it is necessary to convert the logic level (such as a TTL level) into a VCO control signal level by means of the level converter 108.

A specific example of the level converter 108 is shown in FIG. 2. In FIG. 2, the TTL level output signal of the logic circuit 107 (FIG. 1) is applied through an input terminal 210 to an input buffer 201 and is amplified by a first stage amplifier including a transistor 202 and resistors $R_1$, $R_2$ and $R_3$. The output of the amplifier is applied through a coupling capacitor $C_1$ to the second stage amplifier made up of a transistor 203 and resistors $R_4$ through $R_7$. The output of the second stage amplifier is applied through a coupling capacitor $C_2$ to one input terminal of the adder 106, composed of an operational amplifier 204 and resistors $R_8$ and $R_9$, where it is added to the voltage $V_t$ at a terminal 211, which is the output of the LPF 105. The addition output $V_t'$ is provided at a terminal 212 and is employed as the control signal for the VCO 102.

FIGS. 3A to 3C show voltage waveforms in the circuit of FIG. 2. More specifically, FIG. 3A shows the waveform of the logic input data at the terminal 210, which has a logic level in the range of 0 to 5 V in the case of a TTL level. FIG. 3B shows the waveform of the output of the capacitor $C_2$, which has equal levels above and below half the supply voltage $V_{cc}$. FIG. 3C shows the waveform of the output $V_t'$ of the adder 106, which has equal levels above and below the output $V_t$ of the LPF 105.

The circuit shown in FIG. 2 is disadvantageous in that, since a.c. coupling is employed, the output voltage may be varied by the asymmetrical d.c. component of the modulating data itself. This variation, which depends in magnitude on the a.c. coupling time constant, cannot be eliminated. That is, if the time constant is increased, the time during which asymmetrical characteristics are present is increased at the beginning of a data burst, while if the time constant is decreased, unwanted local (short-term) waveform distortion occurs.

FIGS. 4A to 4D show d.c. variations in the circuit shown in FIG. 2. In FIG. 4A, the sign arrangement is such that the balance of 1s and 0s is one-sided; however, with respect to the sign arrangement, the waveform as shown in the FIG. 4B can be obtained by taking the output of the capacitor $C_2$ in the circuit of FIG. 2 into account. At the rear stage of the capacitor $C_2$, the operation is such that the average value of the input signal becomes the reference voltage, and therefore, in the string of 0s, the voltage approaches the reference voltage and the noise margin is decreased. By applying this signal to the frequency modulation input terminal, the frequency is gradually changed.

When burst-signal-like data as shown in FIG. 4C is applied to the circuit shown in FIG. 2, a response as shown in FIG. 4D is obtained. This takes place according to the same principle as that of the above-described operation; that is, it is due to the capacitor's differential operation.

The two operations may be avoided by changing the capacitance value of the capacitor. By increasing the capacitance, with respect to the operation described with reference to FIG. 4B, d.c. variations can be suppressed for a certain period of time, but with respect to the response described with reference to FIG. 4D, the transient effects are increased. It is evident that the operation described with reference to FIG. 4B is greatly affected by reducing the capacitance of the capacitor.

Thus, when a.c. coupling is used, if the data to be modulated is a burst-like signal, theoretically it is impossible to avoid the effects of the coupling capacitor.

SUMMARY OF THE INVENTION

An object of the invention is thus to eliminate the above-described difficulties. More specifically, an object of the invention is to provide a PLL modulation circuit in which, instead of a.c. coupling, d.c. coupling is employed to eliminate the effects of capacitors.

Provided according to the invention is a PLL modulation circuit in which level converting means converts a logic output signal of a logic circuit into a signal having substantially equal levels above and below a predetermined voltage, and the signal thus obtained is superposed on a control voltage of a voltage-controlled oscillator in a PLL circuit so that the output of the voltage-controlled oscillator is subjected to angular modulation, in which according to the invention, the level converting means comprises a pair of voltage dividing resistors for dividing a supply voltage, and a series circuit of a resistor and a switch element connected in parallel with each of the pair of voltage dividing resistors, the switch elements being complementarily operated on and off according to the logic output signal.

BRIEF DESCRIPTION OF THE DRAWINGS

FIG. 1 is a block diagram of a conventional PLL modulation circuit;

FIG. 2 is a circuit diagram showing a level converter in a conventional PLL modulation circuit;

FIGS. 3A to 3C, taken together, are a waveform diagram showing waveforms of signals in the circuit shown in FIG. 2;

FIGS. 4A to 4D, taken together, are a waveform diagram for a description of drawbacks accompanying the circuit shown in FIG. 2;

FIG. 5 is a circuit diagram showing a preferred embodiment of a level converter circuit of the invention;

DESCRIPTION OF THE PREFERRED EMBODIMENTS

Figure 6A:
FIGS. 6A to 6E, taken together, are a waveform diagram showing waveforms of signals in the circuit of FIG. 5.

A preferred embodiment of the invention will be described with reference to the drawings.

FIG. 5 shows examples of a level converter 108 and an adder 106 used in the invention. In FIG. 5, those circuit elements corresponding functionally to those already described with reference to FIG. 2 are designated by corresponding reference numerals.

In FIG. 5, TTL-level logic data is applied to one input terminal of a two-input AND gate 401 after being inverted, and it is further applied to one input terminal of a two-input AND gate 402 directly. Thus, the output of the AND gates 401 and 402 are opposite in phase. In this embodiment, a control signal is applied via a terminal 413 to the other input terminals of the gates 401 and 402, thus performing control according to the presence or absence of the logic data. That is, when there is no data to be modulated, the control signal is set to a low level L so that the outputs of the two gates are also set to L, and when the control signal is raised to a high level H, the logic data (210) becomes effective.

A pair of voltage dividing resistors $R_{10}$ and $R_{20}$ are employed to divide the supply voltage $V_{cc}$. The resistor $R_{10}$ is parallel connected to a series circuit of a switch element 403 and a resistor $r_1$. Similarly, the resistor $R_{20}$ is parallel connected to a series circuit of a switch element 403 and a resistor $r_2$. The switch elements 403 and 404 are operated by the outputs of the gates 401 and 402, respectively. The voltage division output 414 is applied to one input terminal of the adder 106, and it is superposed on the output $V_t$ of the LPF 105 as in the circuit shown in FIG. 2.

The operation of the level converter (from the terminal 210 to the terminal 414) will now be described. When an L signal is applied to the terminal 413, the outputs of the gates 401 and 402 are set to L and the switch elements 403 and 404 are turned off. With $R_{10}=R_{20}$, the voltage at the terminal 414 is half the supply voltage $V_{cc}$, that is, $V_{cc}/2$. On the other hand, when an H signal is applied to the terminal 413, the outputs of the gates 401 and 402 change according to the voltage applied to the terminal 210. When an H signal is applied to the terminal 210, the output of the gate 401 is set to L so that the switch element 403 is turned off while the output of the gate 402 is raised to H so that the switch element 404 is turned on. Under this condition, the voltage $Vm_1$ at the terminal 414 is as follows:

$$Vm_1 = (r_2 \| R_{20})/(R_{10} + r_2 \| R_{20}) \times V_{cc}.$$

When an H signal is applied to the terminal 413 and an L signal is applied to the terminal 210, the output of the gate 401 is raised to H so that the switch element 403 is turned on while the output of the gate 402 is set to 1 and hence the switch element 403 is turned off. Under this condition, the voltage $Vm_2$ at the terminal 414 is:

$$Vm_2 = R_{20}/R_{10} \| r_1 + R_{20}) \times V_{cc}.$$

In general, the modulating signal is symmetrical. Therefore, the resistance should be symmetrical. Accordingly, $r = r_1 = r_2$ and $R = R_{10} = R_{20}$. Hence, the voltage at the terminal 414 is as follows:

$$Vm_0 = \tfrac{1}{2} V_{cc} \tag{1}$$

$$Vm_1 = \tfrac{1}{2} V_{cc} - 1/(2a+1) V_{cc} \tag{2}$$

$$Vm_2 = \tfrac{1}{2} V_{cc} + 1/(2a+1) V_{cc}, \tag{3}$$

where $a = r/R$.

The amounts of shift of expressions (2) and (3) from $Vm_0$ are $\Delta V = \pm 1/(2a+1) V_{cc}$. The voltage changes symmetrically with respect to the voltage $V_{cc}/2$.

Figure 6B:
Figure 6C:
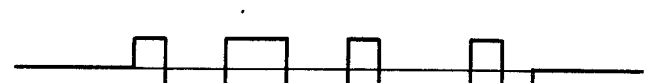
Figure 6D:
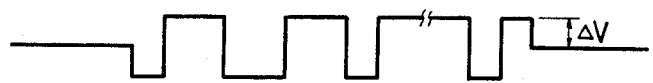

FIG. 6A indicates the control signal applied to the terminal 413. Modulation is inhibited with L and effected with H. FIG. 6B shows the modulation data, which is effective only when the terminal 413 is at H. FIG. 6C shows the output voltage at the terminal 414, which is $\pm \Delta V$ with respect to $V_{cc}/2$. The value of $\Delta V$ can be determined because it depends completely on a $(=r/R)$.

Next, the voltage addition operation will be described. The LPF output voltage of the PLL circuit is applied to the terminal 211. This voltage, substantially a d.c. voltage is the PLL locked state, is applied to the noninverting input terminal of an operational amplifier 405 in FIG. 5. A voltage obtained by voltage dividing the supply voltage with two equal resistors $R_{11}$ and $R_{12}$ connected between the power source and ground is applied through a resistor $R_{13}$ to the inverting input terminal of the operational amplifier 405. The voltage provided at the inverting input terminal is applied to the output terminal of the operational amplifier through a resistor $R_{14}$, which is equal in resistance to the resistor $R_{13}$. Under this condition, the voltage $V_S$ at the output terminal 415 of the operational amplifier 405 is:

$$V_S = 2 V_t - V_{cc}/2, \tag{4}$$

where $V_t$ is the PLL control voltage applied to the terminal 211.

The voltage $V_S$ is equal to the difference between $V_t$ and $V_{cc}/2$. The difference is corrected by an operational amplifier 204 in the following stage which forms a summing amplifier 106. The PLL control voltage $V_t$ is applied to the noninverting input terminal of the amplifier 204. The voltage at the terminal 414 and the voltage at the terminal 415 are applied through respective resistors $R_8$ and $R_{15}$ to the inverting input terminal of the operational amplifier. The voltage at the inverting input terminal of the operational amplifier 204 is applied to the output terminal 212 through a resistor $R_9$, which is equal in resistance to the resistor $R_{15}$.

According to expressions (1) through (4), the output voltage $V_t'$ at the terminal 212 is:

$$V_t' = \frac{R_{15}}{R_8} (V_t \pm \Delta V) + \left(1 - \frac{R_{15}}{R_8}\right) \frac{V_{cc}}{2}. \tag{5}$$

$$V_t' = V_t \pm \Delta V. \tag{6}$$

Therefore, a signal obtained by superposing the modulation signal $\pm \Delta V$ on the voltage applied to the terminal 211 is provided. That is, upon application of the logic level 1 to the terminal 210, the output voltage becomes $V_f - \Delta V$, and upon application of the logic level 0, the output voltage becomes $V_f + \Delta V$.

As described above, in the modulation circuit of the invention, a level converter circuit is realized in which the input data is applied to the original control voltage without using a.c. coupling. Therefore, the above-described difficulties accompanying a conventional modulation circuit utilizing a.c. coupling are eliminated according to the invention.

In other words, employment of an a.c. coupling type modulation circuit suffers from the problem of d.c. component variation. However, these problems are eliminated by employing a d.c. coupling system. In the circuit of the invention, level conversion (such as TTL to analog) of the modulation signal can be readily carried out, and the level used after the conversion can be determined by resistances only.

The above-described circuit of the invention can operate on a single power source. The limit of the modulation frequency depends on the characteristics of the operational amplifier. However, in general, for modulation using the PLL, the modulation sensitivity is substantially equal to the sensitivity of the VCO, and in the described preferred embodiment, the amplitude of the required voltage can be made small. Therefore, the frequency characteristics of the operational amplifier can be utilized up to a sufficiently high frequency, for instance, about 1 MHz.

The above-described PLL modulation circuit is a digital modulation circuit. Next, an application of the invention to a case where the band of the input signal is limited will be described.

Figure 6E:
Figure 7:
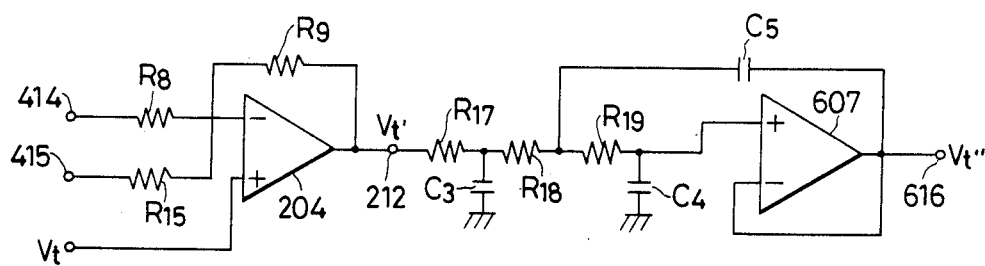
FIG. 7 is a circuit diagram showing an application of the circuit shown in FIG. 5.

In this application, as shown in FIG. 7, an LPF is coupled to the output terminal 212 of the same operational amplifier 204 as that in FIG. 5. In FIG. 7, terminals 415, 414, 211 and 212 correspond to similarly numbered components in FIG. 5. In FIG. 7, an operational amplifier 607 is added to form an LPF. The values of capacitors $C_3$, $C_4$ and $C_5$, and resistors $R_{17}$, $R_{18}$ and $R_{19}$ are selected according to the desired configuration and frequency characteristics of the filter. The frequency characteristics should be determined according to the modulation frequency, and frequencies affecting the whole PLL should not be selected. The waveform of a signal provided at the terminal 616 in the circuit is as shown in FIG. 6E.

The LPF thus constructed may be connected to the terminal 414. That is, if the LPF is inserted in the rear stage of the voltage converter circuit in FIG. 5, the modulated signal, after being limited in band, can be subjected to addition. In any case, the LPF can be added without affecting the d.c. component at all, and the method of realizing the addition of the LPF is simple.

As is apparent from the above description, according to the invention, a PLL modulation circuit is realized utilizing d.c. coupling, and logic levels are converted into appropriate modulation levels by an analog switch arrangement. Therefore, the degree of modulation can be set with resistances only with high accuracy and with high stability, and the circuit for setting the degree of modulation is simple in arrangement.

We claim:

1. A phase-locked loop modulation circuit comprising: level converting means for converting a logic signal into a signal having substantially equal levels above and below a predetermined voltage, said level converting means comprising a pair of voltage dividing resistors for dividing a supply voltage and a pair of series circuits each of a resistor and a switch element connected in series, each of said series circuits being connected in parallel to a respective one of said resistors of said pair of voltage dividing resistors, and means for complementarily operating said switch elements on and off according to said logic signal; a voltage-controlled oscillator; and means for superposing said signal having substantially equal levels on a control voltage of said voltage-controlled oscillator so that an output of said voltage-controlled oscillator is subjected to angular modulation.

2. The phase-locked loop modulation circuit of claim 1, wherein said voltage dividing resistors have equal resistances.

3. The phase-locked loop modulation circuit of claim 1, wherein said means for complementarily operating said switch elements comprises a pair of gates, one of said gates being an inverting gate and the other of said gates being a noninverting gate with respect to said logic signal.

4. The phase-locked loop modulation circuit of claim 2, wherein said superposing means comprises: a first operational amplifier receiving said control voltage on a noninverting input terminal thereof; a second pair of voltage dividing resistors for dividing said supply voltage; a third resistor coupled between an inverting input terminal of said first operational amplifier and a junction point of said second pair of voltage dividing resistors; a fourth resistor, having a resistance equal to that of said third resistor, coupled between an output terminal of said operational amplifier and said inverting input terminal of said operational amplifier; a second operational amplifier having a noninverting input terminal coupled to said noninverting input terminal of said first operational amplifier; a fifth resistor coupled between said output of said first operational amplifier and an inverting input terminal of said second operational amplifier; a sixth resistor, having a resistance equal to that of said fifth resistor, coupled between an output of said second operational amplifier and said inverting input terminal of said second operational amplifier; and a seventh resistor coupled between a junction point of said first-mentioned pair of voltage dividing resistors and said inverting input terminal of said second operational amplifier.

5. The phase-locked loop modulation circuit of claim 4, further comprising: a third operational amplifier; an RC low-pass filter coupled between said output of said second operational amplifier and a noninverting input terminal of said third operational amplifier, an output terminal of said third operational amplifier being coupled to an inverting input terminal of said third operational amplifier; and a capacitor coupled between said output of said third operational amplifier and an intermediate point of said low-pass filter.

* * * * *